(12) United States Patent
Kim et al.

(10) Patent No.: US 12,154,859 B2
(45) Date of Patent: Nov. 26, 2024

(54) SEMICONDUCTOR PACKAGE AND METHOD OF MANUFACTURING SAME

(71) Applicant: SAMSUNG ELECTRONICS CO., LTD., Suwon-si (KR)

(72) Inventors: Woonchun Kim, Suwon-si (KR); Seungwan Shin, Hwaseong-si (KR); Gun Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 423 days.

(21) Appl. No.: 17/707,002

(22) Filed: Mar. 29, 2022

(65) Prior Publication Data

US 2023/0067767 A1  Mar. 2, 2023

(30) Foreign Application Priority Data

Aug. 25, 2021 (KR) ........................ 10-2021-0112491

(51) Int. Cl.
| | |
|---|---|
| *H01L 23/538* | (2006.01) |
| *H01L 21/48* | (2006.01) |
| *H01L 21/768* | (2006.01) |
| *H01L 23/31* | (2006.01) |
| *H01L 23/48* | (2006.01) |

(Continued)

(52) U.S. Cl.
CPC ...... *H01L 23/5386* (2013.01); *H01L 21/4857* (2013.01); *H01L 21/486* (2013.01); *H01L 21/76873* (2013.01); *H01L 23/3128* (2013.01); *H01L 23/481* (2013.01); *H01L 23/49816* (2013.01); *H01L 23/49822* (2013.01); *H01L 23/49838* (2013.01); *H01L 23/5226* (2013.01); *H01L 23/5283* (2013.01); *H01L 23/53238* (2013.01); *H01L 23/5383* (2013.01); *H01L 25/105* (2013.01); *H01L 2225/06506* (2013.01); *H01L 2225/0651* (2013.01); *H01L 2225/06548* (2013.01); *H01L 2225/06562* (2013.01); *H01L 2225/1023* (2013.01); *H01L 2225/1041* (2013.01); *H01L 2225/1058* (2013.01)

(58) Field of Classification Search
None
See application file for complete search history.

(56) References Cited

U.S. PATENT DOCUMENTS

| | | |
|---|---|---|
| 10,741,416 B2 | 8/2020 | Lin et al. |
| 10,818,603 B2 | 10/2020 | Jee et al. |

(Continued)

FOREIGN PATENT DOCUMENTS

KR    10-2019-0136240 A    12/2019

*Primary Examiner* — Asok K Sarkar
(74) *Attorney, Agent, or Firm* — Fish & Richardson P.C.

(57) ABSTRACT

A semiconductor package includes; a first redistribution structure including first redistribution conductors, a semiconductor chip on the first redistribution structure and including connection pads electrically connecting the first redistribution conductors, a connection conductor on the first redistribution structure, laterally spaced apart from the semiconductor chip, and electrically connected to the first redistribution conductors, an encapsulant on the first redistribution structure and sealing the semiconductor chip and at least a portion of the connection conductor, a barrier layer extending along an upper surface of the encapsulant, and a second redistribution conductor on the barrier layer and penetrating the barrier layer to contact the connection conductor.

20 Claims, 11 Drawing Sheets

(51) Int. Cl.
*H01L 23/498* (2006.01)
*H01L 23/522* (2006.01)
*H01L 23/528* (2006.01)
*H01L 23/532* (2006.01)
*H01L 25/10* (2006.01)

(56) References Cited

U.S. PATENT DOCUMENTS

| | | |
|---|---|---|
| 10,825,776 B2 | 11/2020 | Jung et al. |
| 2014/0210081 A1 | 7/2014 | Lin et al. |
| 2019/0273845 A1* | 9/2019 | Jährig ................. H04N 7/0117 |
| 2020/0219832 A1 | 7/2020 | Marimuthu et al. |
| 2020/0273804 A1* | 8/2020 | Jeon ....................... H01L 24/20 |
| 2020/0312801 A1 | 10/2020 | Ko et al. |
| 2021/0035961 A1 | 2/2021 | Lim et al. |
| 2021/0118792 A1 | 4/2021 | Lee et al. |

\* cited by examiner

SEMICONDUCTOR PACKAGE AND METHOD OF MANUFACTURING SAME

CROSS-REFERENCE TO RELATED APPLICATION(S)

This application claims the benefit under 35 USC 119(a) of Korean Patent Application No. 10-2021-0112491 filed on Aug. 25, 2021 in the Korean Intellectual Property Office, the subject matter of which is hereby incorporated by reference in its entirety.

BACKGROUND

The inventive concept relates generally to semiconductor packages and methods of manufacturing same.

In response to recent demands for electronic devices to provide enhanced performance and reduced physical size, mounting areas (or footprints) allocated for semiconductor packages within such electronic devices have been reduced.

Accordingly, certain package-on-package (PoP) structures including multiple, stacked semiconductor chips have been proposed. In order to implement various PoP structures within high-performance semiconductor packages, it is often necessary to form a backside redistribution structure on a lowermost semiconductor package with a very fine pitch.

SUMMARY

Embodiments of the inventive concept provide semiconductor packages including a backside redistribution structure having a very fine pitch.

According to embodiments of the inventive concept, a semiconductor package may include; a first redistribution structure including first redistribution conductors, a semiconductor chip on the first redistribution structure and including connection pads electrically connecting the first redistribution conductors, a connection conductor on the first redistribution structure, laterally spaced apart from the semiconductor chip, and electrically connected to the first redistribution conductors, an encapsulant on the first redistribution structure and sealing the semiconductor chip and at least a portion of the connection conductor, a barrier layer extending along an upper surface of the encapsulant, and a second redistribution conductor on the barrier layer and penetrating the barrier layer to contact the connection conductor.

According to embodiments of the inventive concept, a semiconductor package may include; a first redistribution structure including first redistribution conductors, a semiconductor chip on the first redistribution structure and including connection pads electrically connecting the first redistribution conductors, a connection conductor on the first redistribution structure, laterally spaced apart from the semiconductor chip, and electrically connecting the first redistribution conductors, an encapsulant on the first redistribution structure and sealing the semiconductor chip and at least a portion of the connection conductor, a barrier layer on the encapsulant, and a second redistribution conductor electrically connected to the first redistribution conductor through the connection conductor and including a pattern portion on the barrier layer, and a via portion penetrating through the barrier layer and extending from the pattern portion towards the connection conductor.

According to embodiments of the inventive concept, a semiconductor package may include; a first redistribution structure including first redistribution conductors, a semiconductor chip on the first redistribution structure and including connection pads electrically connected to the first redistribution conductors, a connection conductor on the first redistribution structure, laterally spaced apart from the semiconductor chip, and including a first seed layer and a first plating layer on the first seed layer, an encapsulant sealing the semiconductor chip and at least a portion of the connection conductor, a barrier layer extending along an upper surface of the encapsulant, and a second redistribution conductor on the barrier layer, penetrating through the barrier layer to contact the connection conductor, and including a second seed layer and a second plating layer on the second seed layer.

According to embodiments of the inventive concept, a method of manufacturing a semiconductor package may include; preparing a carrier on which a preliminary barrier layer and a preliminary encapsulant are sequentially stacked, disposing a semiconductor chip and a connection conductor on a tape, transferring a preliminary encapsulant and a preliminary barrier layer onto the semiconductor chip and the connection conductor using the carrier, and forming an encapsulant to encapsulate the semiconductor chip and at least a portion of the connection conductor, forming a through-hole penetrating the preliminary barrier layer on the encapsulant and a portion of the encapsulant covering an upper portion of the connection conductor, forming a preliminary seed layer along surfaces of the preliminary barrier layer and the encapsulant, forming a plating layer on the preliminary seed layer using a patterned photosensitive material layer, and removing the patterned photosensitive material layer and etching the preliminary barrier layer and the preliminary seed layer exposed from the plating layer.

BRIEF DESCRIPTION OF DRAWINGS

The above and other aspects, features, and advantages of the inventive concept may be more clearly understood upon consideration of the following detailed description together with the accompanying drawings, in which:

FIG. 1, including FIGS. 1A, 1B and 1C, illustrates a semiconductor package 100 according to embodiments of the inventive concept, wherein

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1A:
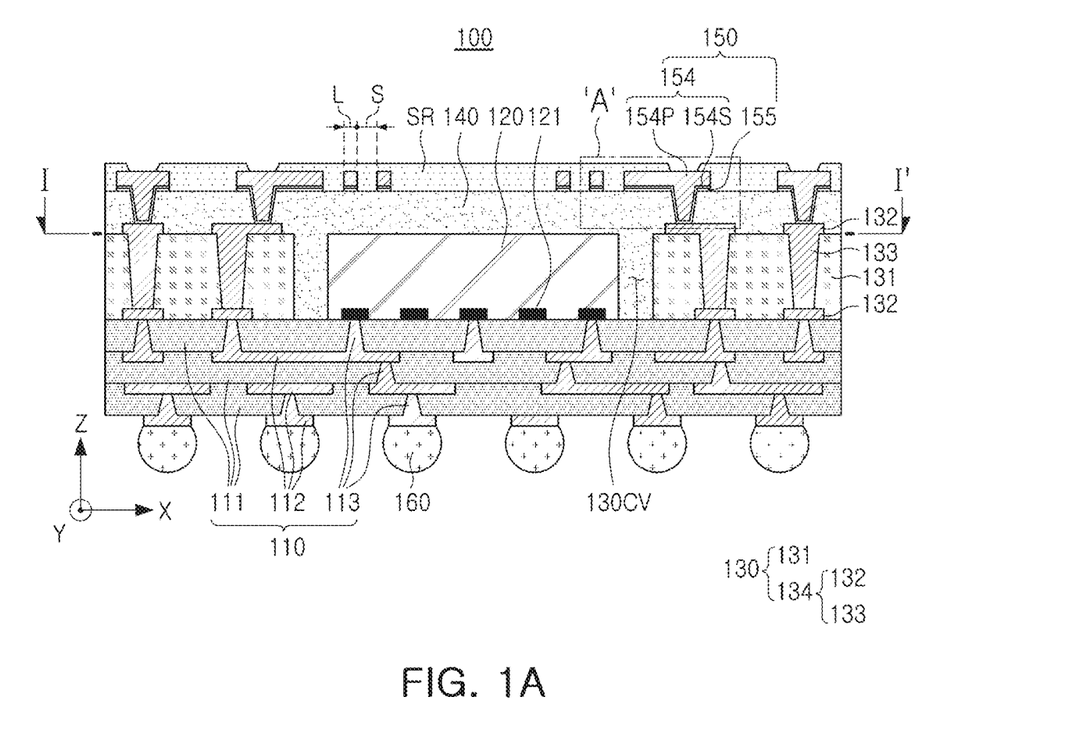
FIG. 1A is a cross-sectional of the semiconductor package 100.
Figure 1B:
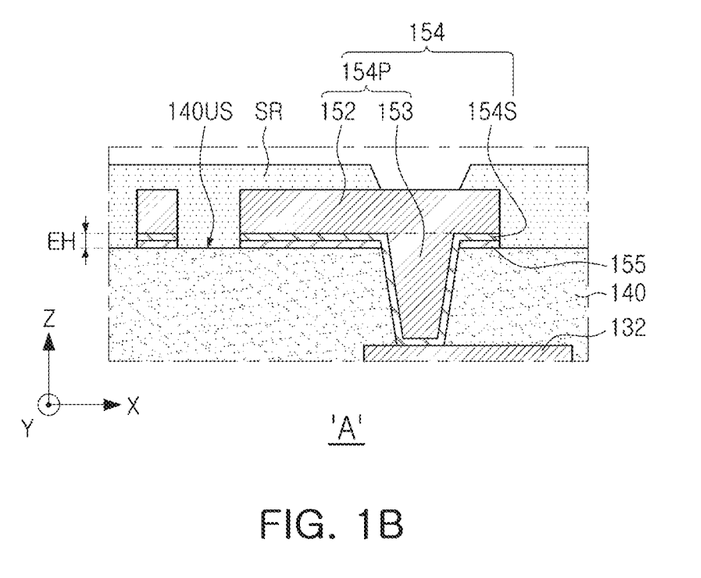
FIG. 1B is an enlarged view of region 'A' indicated in FIG. 1A.
Figure 1C:
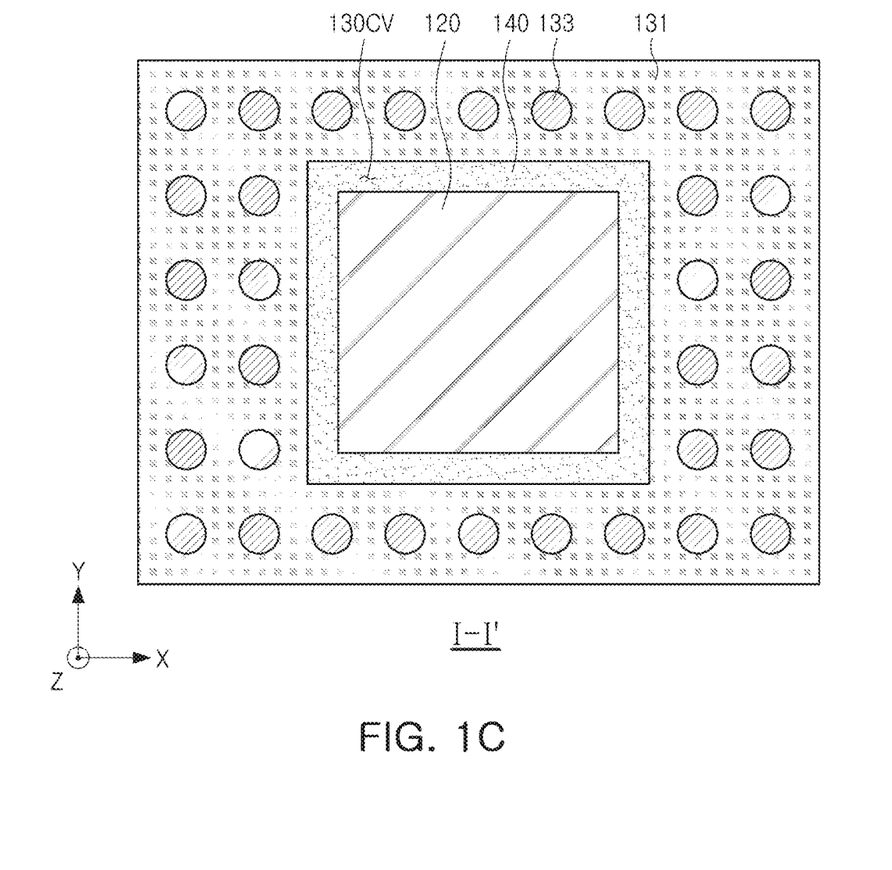
FIG. 1C is a plan (or top-down) view taken along line I-I' of FIG. 1A.

FIG. 1, including FIGS. 1A, 1B and 1C as described above, illustrates a semiconductor package 100 according to embodiments of the inventive concept.

Referring to FIG. 1, the semiconductor package 100 may include a first redistribution structure 110, a semiconductor chip 120, a connection structure 130, an encapsulant 140, and a second redistribution structure 150. According to certain embodiments of the inventive concept, by introducing a barrier layer 155 between the encapsulant 140 and a backside redistribution conductor 154 (hereinafter, referred to as a "second redistribution conductor") of the semiconductor package 100, the second redistribution conductor 154 may be formed with a fine pitch, thereby enabling the overall thickness (or height as measured in a vertical (or Z) direction) of the semiconductor package 100 to be markedly reduced.

The first redistribution structure 110 may be a support substrate on which the semiconductor chip 120 is "mounted" (e.g., mechanically assembled and/or electrically connected), and may include an insulating layer 111, and first redistribution conductors 112 and 113 for redistribution of connection pads 121 of the semiconductor chip 120. The first redistribution conductors 112 and 113 may include a first redistribution layer 112 disposed on the insulating layer 111, and a first redistribution via 113 penetrating through the insulating layer 111. The first redistribution structure 110 may include more or less insulating layers 111, first redistribution layers 112, and first redistribution vias 113 than illustrated in the drawings. A connection bump 160 electrically connected to the first redistribution conductors 112 and 113 may be disposed below the first redistribution structure 110. The connection bump 160 may be disposed under (or on a lower surface of) a lowermost redistribution layer, and may have a spherical or ball shape formed of a low-melting-point metal, such as for example, tin (Sn), indium (In), bismuth (Bi), antimony (Sb), copper (Cu), silver (Ag), zinc (Zn), lead (Pb), or alloys thereof (e.g., Sn—Ag—Cu).

The insulating layer 111 may include an one or more insulating resin(s). Examples of insulating resins include a thermosetting resin such as an epoxy resin, a thermoplastic resin such as polyimide, or a resin impregnated with an inorganic filler and/or glass fiber (glass fiber, glass cloth, glass fabric) in these resins, for example, a prepreg, Ajinomoto Build-up Film (ABF), FR-4, and BT. For example, the insulating layer 111 may include a photosensitive resin such as a photo-imageable dielectric (PID). The insulating layer 111 may include a multiple, vertically stacked, insulating layers 111. Depending on the nature and use of various manufacturing process(es), respective boundaries between the multiple insulating layers 111 may be diffuse, unclear and/or irregularly shaped. Here, only three (3) insulating layers 111 are illustrated, but those skilled in the art will recognize that any reasonable number of insulating layers 111 may be used in embodiments of the inventive concept.

The first redistribution layer 112 may include at least on metal, such as for example, Cu, Ag, Sn, Au, Pb, nickel (Ni), aluminum (Al), and titanium (Ti). The first redistribution layer 112 may include at least one of ground pattern(s), power pattern(s), and/or signal pattern(s). Here, a signal pattern may provide a path through which various command, control, address, and/or data signals associated with the operation of the semiconductor chip 120 may be transmitted and/or received (hereafter, "communicated"). In some embodiments, the first redistribution layer 112 may include multiple first redistribution layers 112 respectively disposed (e.g., between) in relation to multiple insulating layers 111. The first redistribution layers 112 may be variously interconnected through multiple first redistribution vias 113. In this regard, a lowermost redistribution layer 112 may contact the connection bump 160 and may be formed with a thickness that is greater than other redistribution layers 112. The number of first redistribution layers 112 and the number of insulating layers 111 will vary by design.

The first redistribution vias 113 may variously interconnect the first redistribution layers 112 and may include signal via(s), ground via(s), and/or power via(s). Each of the first redistribution vias 113 may include at least one metal, such as for example, Cu, Al, Ag, Sn, Au, Ni, Pb and Ti. Each of the first redistribution vias 113 may have a filled-via type structure in which the interior of a via hole is filled with metal(s), or a conformal-via type in which metal(s) are formed along an inner wall of the via hole. The first redistribution vias 113 may be respectively integrated with the first redistribution layers 112, but embodiments of the inventive concept are not limited thereto.

The semiconductor chip 120 may be disposed on the first redistribution structure 110 using the connection pads 121 to connect the first redistribution conductors 112 and 113. The semiconductor chip 120 may be a bare integrated circuit (IC) in which a separate bump or wiring layer is not formed, but embodiments of the inventive concept are not limited thereto. Alternately, the semiconductor chip 120 may be a package-type integrated circuit. Accordingly, the connection pads 121 may include pads (e.g., an A1 pad) of a bare chip or a bump formed on the pad. In this regard, the integrated circuit may be formed on an active wafer. The semiconductor chip 120 may include silicon (Si), germanium (Ge), or gallium arsenide (GaAs), and may be provided as various types of integrated circuits. For example, the integrated circuit may be a processor chip, such as a central processor (CPU), a graphics processor (GPU), a field programmable gate array (FPGA), an application processor (AP), a digital signal processor, a cryptographic processor, a microprocessor, a microcontroller, but embodiments of the inventive concept are not limited thereto. Alternately, the integrated circuit may be a logic chip, such as an analog-to-digital converter (ADC) or an application-specific IC (ASIC). Alternately, the integrated circuit may be a memory chip, such as a volatile memory (e.g., a Dynamic Random Access Memory (RAM (DRAM) or a static RAM (SRAM)) or non-volatile memory (e.g., a Read Only Memory (ROM), flash memory, etc.). The connection pads 121 may electrically connect the integrated circuit of the semiconductor chip 120 to other components.

The connection structure 130 may be disposed on the first redistribution structure 110 so as to be laterally (or horizontally) spaced apart from the semiconductor chip 120. In this regard, the connection structure 130 may provide one or more electrical paths connecting the first redistribution conductors 112 and 113 of the first redistribution layer 110 with the second redistribution conductor 154. In some embodiments, the connection structure 130 may substantially surround the semiconductor chip 120.

The connection structure 130 may include a frame insulating layer 131, and a connection conductor 134 electrically connecting the first redistribution conductors 112 and 113 and the second redistribution conductor 154 through the frame insulating layer 131. For example, the connection conductor 134 may include wiring layers 132 disposed on upper and lower surfaces of the frame insulating layer 131, and a wiring via 133 penetrating (or passing) through the frame insulating layer 131. In this regard, the connection structure 130 may define (or variously improve) the rigidity of the semiconductor package 100 depending on the choice of the material(s) for the frame insulating layer 131. Here, rigidity of the frame (and the semiconductor package 100) may be an important consideration in securing a uniform thickness for the encapsulant 140. Further in this regard, the connection structure 130 may define, at least in part, a cavity 130CV in which the semiconductor chip 120 may be disposed.

In some embodiments, the frame insulating layer 131 may include one of more insulating materials, such as thermosetting resin (e.g., an epoxy resin), thermoplastic resin (e.g., polyimide), and/or resin(s) mixed with an inorganic filler (e.g., ABF or prepreg). Alternately, a material (e.g., glass fiber) impregnated with one or more of the foregoing resin(s) may be used to form the frame insulating layer 131.

The wiring layers 132 and the wiring vias 133 may variously provide electrical connection paths within the semiconductor package 100, and may be variously connected to the connection pads 121. Here, the wiring layers 132 may include at least one metal, such as for example, Cu, Al, Ag, Sn, Au, Ni, Pb and Ti. The wiring layer 132 may include ground pattern(s), power pattern(s), and/or signal pattern(s). In some embodiments, the wiring layer 132 may be formed using a plating process such as SAP or MSAP, and may include a seed layer and a conductor layer.

In some embodiments, a thickness of each of the wiring layers 132 may be greater than a thickness of each of the first redistribution layers 112, and the connection structure 130 may have a thickness greater than or equal to a thickness of the semiconductor chip 120.

In some embodiments, the frame insulating layer 111 may include a prepreg or the like to maintain rigidity, while the insulating layer 111 may include a photosensitive material (e.g., PID), wherein the first redistribution structure 110 is associated with a microcircuit or a high-density design. The thickness of the wiring layer 132 may be greater than a thickness of the first redistribution layer 112.

The wiring vias 133 electrically connecting the wiring layers 132 may be formed in different vertical layers to variously form electrical paths associated with the connection structure 110. Here, the wiring vias 133 may include at least one metal, such as for example, Cu, A), Ag, Sn, Au, Ni, Pb and Ti. The wiring vias 133 may include signal via(s), power via(s), and/or ground via(s). Each of the wiring vias 133 may be a filled-type via filled with a metal material or a conformal-type via in which a metal material is formed along a wall surface of a via hole, and in addition, may each have a tapered shape. The wiring via 133 may be formed using a plating process, and may include a seed layer and a conductor layer. The wiring vias 133 may be variously integrated with the wiring layer 132.

The encapsulant 140 may be used to substantially encapsulate the semiconductor chip 120 and at least a portion of the connection structure 130 (e.g., the connection conductor 134). In this regard, the encapsulant 140 may be disposed on the first redistribution structure 110. Thus, in some embodiments, the encapsulant 140 may cover the upper surface and side surfaces of the semiconductor chip 120, as well as the upper surface of the connection structure 130 (e.g., an upper surface of the connection conductor 134).

The encapsulant 140 may include an insulating material (e.g., ABF) including an inorganic filler in an insulating resin, such as an epoxy resin. To secure an acceptable fillability characteristic for the insulating material (e.g., as between the semiconductor chip 120 and the connection structure 130), if the encapsulant 140 includes a film-type preliminary encapsulant (see, e.g., 140' of FIG. 2A, hereafter) containing an inorganic filler, it may be difficult to reduce the thickness of the seed layer due to the influence of the inorganic filler on the surface of the encapsulant 140, and as a result, there may be a limitation on implementing the second redistribution conductor 154 with a fine pitch. Therefore, embodiments of the inventive concept provide the barrier layer 155 which is resistant to oxidation, and may first be provided on the surface of the encapsulant 140 including the inorganic filler. As a result, a seed layer 154S may be formed on the barrier layer 155 using a sputtering process, thereby significantly reducing the thickness of the seed layer 154S. And as a further result, the second redistribution conductor 154 may be implemented with a fine pitch.

Accordingly, the second redistribution conductor 154 may be formed of the seed layer 154S and a plating layer 154P penetrating (or passing through) the barrier layer 155 and the cover region of the encapsulant 140 and may be electrically connected to the connection conductor 134.

The second redistribution structure 150 may include the second redistribution conductor 154 connected to the connection conductor 134 and the barrier layer 155. The second redistribution conductor 154 may be electrically connected to the first redistribution conductors 112 and 113 through the connection conductor 134. As described above, the barrier layer 155 is formed by transferring a preliminary barrier layer (see, e.g., 155' of FIG. 2B hereafter) formed by the sputtering process, and thus, may not be formed on the side surface of the via portion 153 of the second redistribution conductor 154 extending into the encapsulant 140 and contacting the connection conductor 134.

The barrier layer 155 may extend along the upper surface of the encapsulant 140, and may be formed of at least one metal resistant to oxidation, such as for example, Ni or a Ni alloy.

In some embodiments, the barrier layer 155 may be formed by transferring a preliminary barrier layer formed on the carrier onto the semiconductor chip 120 using a sputtering process. In this regard, one possible method of forming the barrier layer 155 will be described hereafter in relation to FIGS. 2A to 2I.

The barrier layer 155 may be disposed on only the upper surface of the encapsulant 140, and thus, need not contact the connection conductor 134—in contrast to the second redistribution conductor 154. In addition, the barrier layer 155 or the preliminary barrier layer (e.g., 155' of FIG. 2B) may have a thickness of about 1 µm or less (e.g., a thickness ranging from about 1 µm to about 0.001 µm, a thickness ranging from about 0.5 µm to about 0.001 µm, a thickness ranging from about 0.3 µm to about 0.001 µm, or a thickness ranging from about 0.1 µm to about 0.001 µm—according to various embodiments of the inventive concept). As described above, the barrier layer 155 may be provided in the form of a thin film covering the upper surface of the encapsulant 140 using a sputtering process to form the seed layer 154S of the second redistribution conductor 154.

The second redistribution conductor 154 may be disposed on the encapsulant 140 and the barrier layer 155, penetrate the barrier layer 155, extend into the encapsulant 140, and contact the connection conductor 134. For example, the second redistribution conductor 154 may include the plating layer 154P formed of a pattern portion 152 and a via portion 153, and the seed layer 154S disposed below the plating layer 154P, for example, extending along the lower surface of the pattern portion 152 and the side surface and the lower surface of the via portion 153. The seed layer 154S may extend along the upper surface of the barrier layer 155 and the inner surface of the through-hole (VH in FIG. 2E) penetrating through the barrier layer 155 and a portion (the 'cover region') of the encapsulant 140 to expose at least a portion (e.g., 132) of the connection conductor 134. Therefore, the seed layer 154S may be separated from the upper surface 140US of the encapsulant 140 by the barrier layer 155, and may directly contact the encapsulant 140, within the through-hole (VH in FIG. 2E). The seed layer 154S may be directly deposited on the barrier layer 155 using a sputtering process, and the seed layer 154S may have a thickness of about 1 μm or less, for example, ranging from about 1 μm to about 0.001 μm, from about 0.5 μm to about 0.001 μm, from about 0.3 μm to about 0.001 μm, from about 0.1 μm to about 0.001 μm, or the like. The pattern portion 152 of the plating layer 154P may be disposed on the barrier layer 155 and the seed layer 154S. The via portion 153 of the plating layer 154P extends from the pattern portion 152 toward the connection conductor 134 by penetrating through the barrier layer 155, and may be disposed in the through-hole (VH in FIG. 2E). Since the pattern portion 152 and the via portion 153 are integrated, the boundary therebetween may not be clear, but the inventive concept is not limited thereto. The seed layer 154S and the plating layer 154P may include at least one metal, such as for example, Cu or a Cu alloy. The second redistribution conductor 154 is formed by a plating process (e.g., MSAP) using the thinned barrier layer 155 and the seed layer 154S, and thus, may have a line (L) and space (S) standard of a predetermined level or less. Here, for example, a line width 'L' of the pattern portion 152 extending in one direction may be about 7 μm or less (e.g., may range from about 7 μm to about 0.0001 μm, about 6 μm to about 0.0001 μm, about 5 μm to about 0.0001 μm, or the like). In addition, a spacing S between adjacent pattern portions 152 may be about 8 μm or less (e.g., may range from about 8 μm to about 0.0001 μm, about 7 μm to about 0.0001 μm, about 6 μm to about 0.0001 μm, or the like). In addition, a combined thickness EH of the seed layer 154S and the barrier layer 155 disposed below the pattern portion 152 may be about 1 μm or less (e.g., may range from about 1 μm to about 0.001 μm, about 0.8 μm to about 0.001 μm, about 0.6 μm to about 0.001 μm, or the like).

In some embodiments, the semiconductor package 100 may further include a solder resist layer SR covering the second redistribution conductor 154, on the encapsulant 140, and having an opening exposing at least a portion of the second redistribution conductor 154. The solder resist layer SR may protect the second redistribution conductor 154 from physical and chemical damage. The solder resist layer SR includes an insulating material, and may be formed using, for example, prepreg, ABF, BT, or photo solder resist (PSR).

FIGS. 2A to 2I are related cross-sectional views illustrating in one example a method of manufacturing a semiconductor package according to embodiments of the inventive concept. Here, the manufacturing process of FIGS. 2A to 2I is drawn in relation to the semiconductor package 100 of FIG. 1.

Figure 2A:
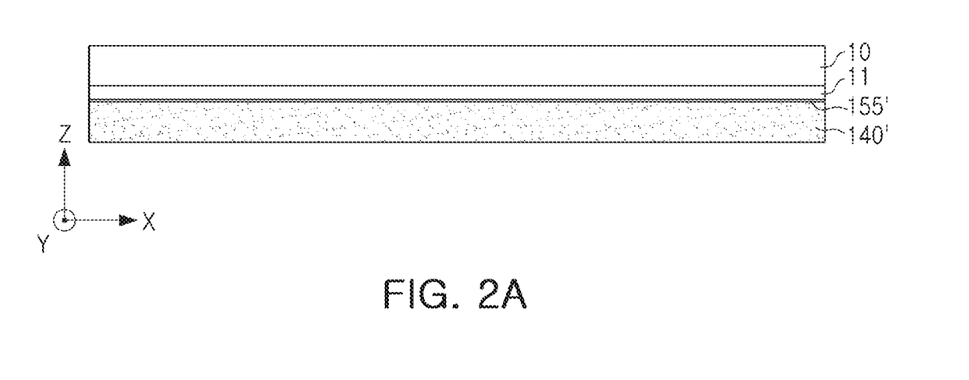
FIGS. 2A, 2B, 2C, 2D, 2E, 2F, 2G, 2H and 2I (hereafter collectively, "FIGS. 2A to 2I") are related cross-sectional views illustrating in one example a method of manufacturing a semiconductor package according to embodiments of the inventive concept.

Referring to FIG. 2A, first, a carrier 10 on which a preliminary barrier layer 155' and a preliminary encapsulant 140' are sequentially stacked may be prepared. The carrier 10 may be, for example, in a state in which a metal foil 11 is formed on one or both surfaces of a copper clad laminate (CCL). A release layer for peeling of the carrier 10 may be interposed between the carrier 10 and the metal foil 11. The preliminary barrier layer 155' may be formed on the metal foil 11 using a sputtering process. The preliminary barrier layer 155' may include a metal having excellent corrosion resistance (e.g., Ni or Ni alloy). The preliminary encapsulant 140' may be formed by attaching a film-type insulating material to the preliminary barrier layer 155'. The preliminary encapsulant 140' may be formed of an insulating resin including an inorganic filler. In an example embodiment, the preliminary encapsulant 140' may be transferred together with the preliminary barrier layer 155' to form the encapsulant 140 of FIG. 1A. However, depending on specific embodiment, the transfer process of the preliminary encapsulant 140' and the preliminary barrier layer 155' may be performed separately. In this case, an insulating layer for improving adhesion may be interposed between the encapsulant 140 and the barrier layer 155. (See, e.g., FIG. 4).

Figure 2B:
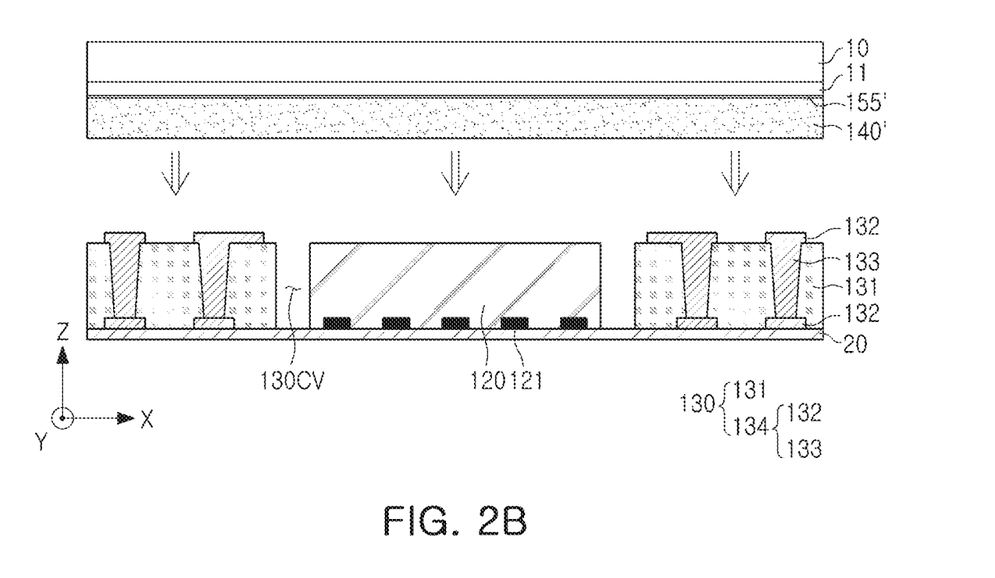

Referring to FIG. 2B, the semiconductor chip 120 and the connection structure 130 (or the connection conductor 134) are disposed on a tape 20, and then, the preliminary encapsulant 140' and the preliminary barrier layer 155' may be transferred onto the semiconductor chip 120 and the connection structure 130 using the carrier 10. The tape 20 may support the semiconductor chip 120 and the connection structure 130, as an adhesive temporary carrier. For example, the semiconductor chip 120 may be disposed in the cavity 130CV surrounded by the connection structure 130. The connection structure 130 may include a connection conductor 134 that provides an electrical path in a vertical direction and is disposed to one side of the semiconductor chip 120. After transferring the preliminary encapsulant 140' and the preliminary barrier layer 155', the carrier 10 may be removed and the metal foil 11 may be etched to expose the preliminary barrier layer 155'. Before or after removing the carrier 10, the preliminary encapsulant 140' may be cured to form the encapsulant 140.

Figure 2C:
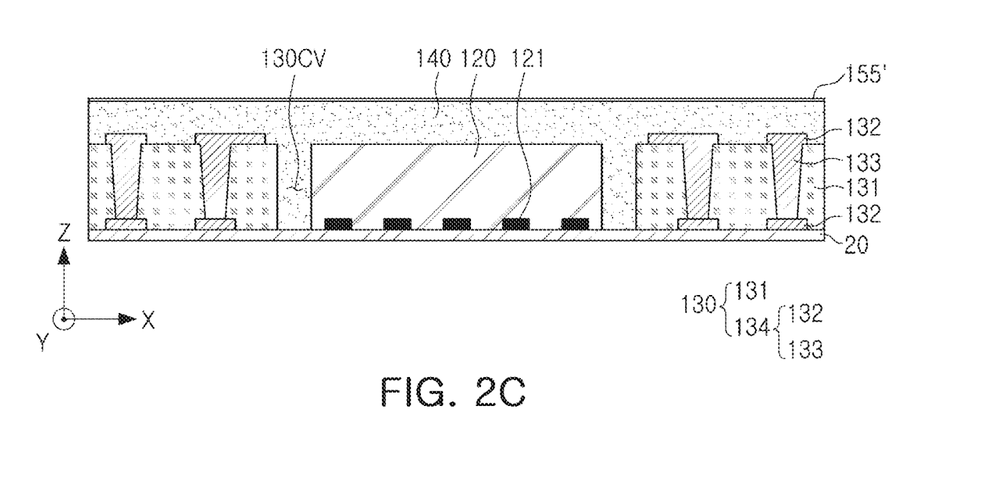

Referring to FIG. 2C, the encapsulant 140 sealing the semiconductor chip 120 and the connection structure 130 (or the connection conductor 134) may be formed by curing the preliminary encapsulant 140' of FIG. 2B. As described above, the encapsulant 140 may be formed before or after the carrier 10 is removed. The preliminary barrier layer 155' may be disposed on the encapsulant 140 to cover the entire upper surface thereof. The preliminary barrier layer 155' may include a metal having strong corrosion resistance (e.g., Ni or a Ni alloy). In some embodiments, the thickness of the preliminary barrier layer 155' may range from about 0.1 μm to about 0.2 μm.

Figure 2D:
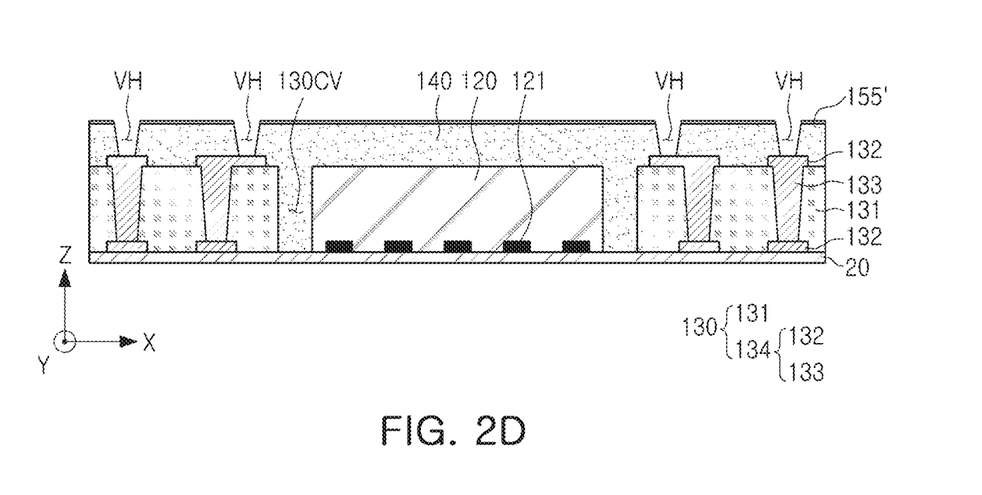

Referring to FIG. 2D, a through-hole VH penetrating through the preliminary barrier layer 155' and a portion of the encapsulant 140 covering the upper portion of the connection conductor 134 may be formed. The through-hole VH may be formed by removing a portion of each of the preliminary barrier layer 155' and the encapsulant 140 using laser drilling or the like. The through-hole VH may have a tapered inner wall, but the configuration is not limited thereto. Also, the through-hole VH may be formed to expose a portion of the connection conductor 134, for example, an upper surface of the wiring layer 132. The through-hole VH completely penetrates through the preliminary barrier layer 155', and an inner wall of the through-hole VH may be provided by the preliminary barrier layer 155' and the encapsulant 140.

Figure 2E:
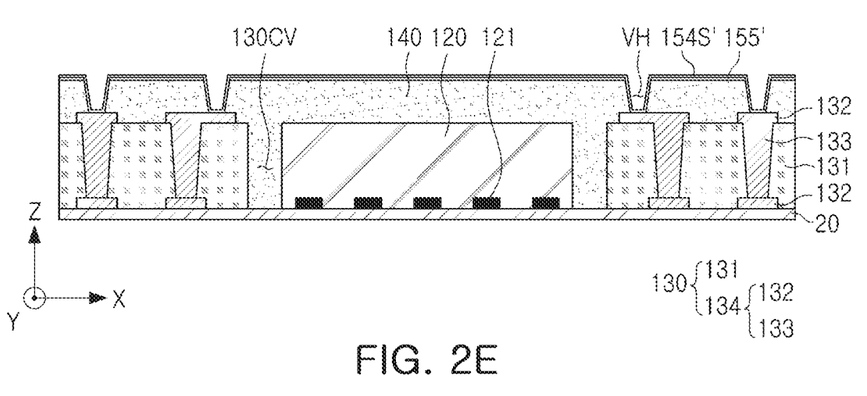

Referring to FIG. 2E, a preliminary seed layer 154S' may be formed along the surfaces of the preliminary barrier layer 155' and the encapsulant 140. The preliminary seed layer 154S' may be conformally formed along the upper surface of the preliminary barrier layer 155', the inner wall surface of the through-hole VH, and the connection conductor 134 exposed through the through-hole VH, for example, the upper surface of the wiring layer 132. According to an example embodiment of the inventive concept, a sputtering process may be performed on the encapsulant 140 by covering most of the surface of the encapsulant 140 including an inorganic filler with the preliminary barrier layer 155'. Accordingly, the preliminary seed layer 154S' may be formed by a sputtering process and may include Cu or a Cu alloy.

Figure 2F:
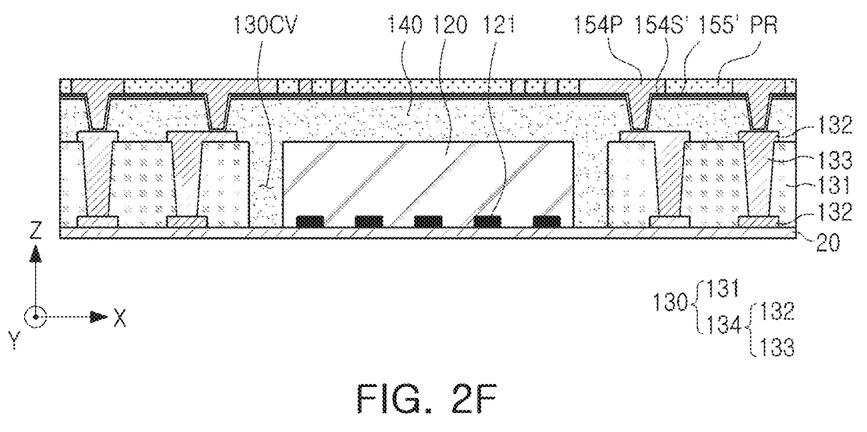

Referring to FIG. 2F, a patterned photosensitive material layer PR may be formed on the preliminary seed layer 154S', and a plating layer 154P may be formed on the preliminary seed layer 154S' using the patterned photosensitive material layer PR. The photosensitive material layer PR may be patterned by a photolithography process including an exposure process, a developing process and the like. The plating layer 154P may be formed by performing an electroplating process (e.g., MSAP) using the preliminary seed layer 154S'. The plating layer 154P may include a metal similar to that of the preliminary seed layer 154S' (e.g., Cu or a Cu alloy). Thereafter, after removing the photosensitive material layer PR, an etching process may be performed to pattern the preliminary seed layer 154S' and the preliminary barrier layer 155'.

Figure 2G:
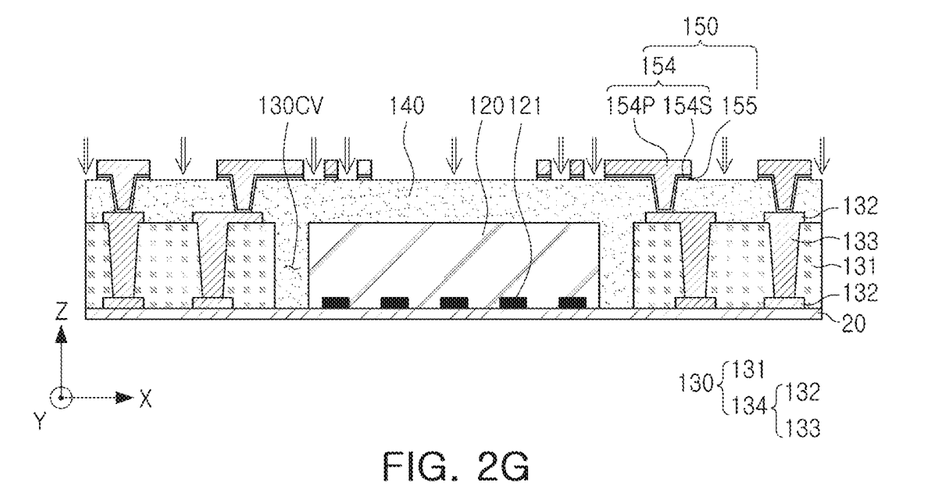

Referring to FIG. 2G, the patterned photosensitive material layer (PR in FIG. 2F) is removed, and the preliminary seed layer (154S' in FIG. 2F) and the preliminary barrier layer (155' in FIG. 2F) exposed from the plating layer 154P are etched to form the seed layer 154S and the barrier layer 155. As described above, when the seed layer 154S and the barrier layer 155 are formed using the transfer process and the sputtering process, the seed layer 154S and the barrier layer 155 may be thinned, and as a result, the plating layer 154P may be formed more finely. For example, the combination of thicknesses for the seed layer 154S and the barrier layer 155 removed by the etching process may range from about 0.6 µm or less.

Figure 2H:
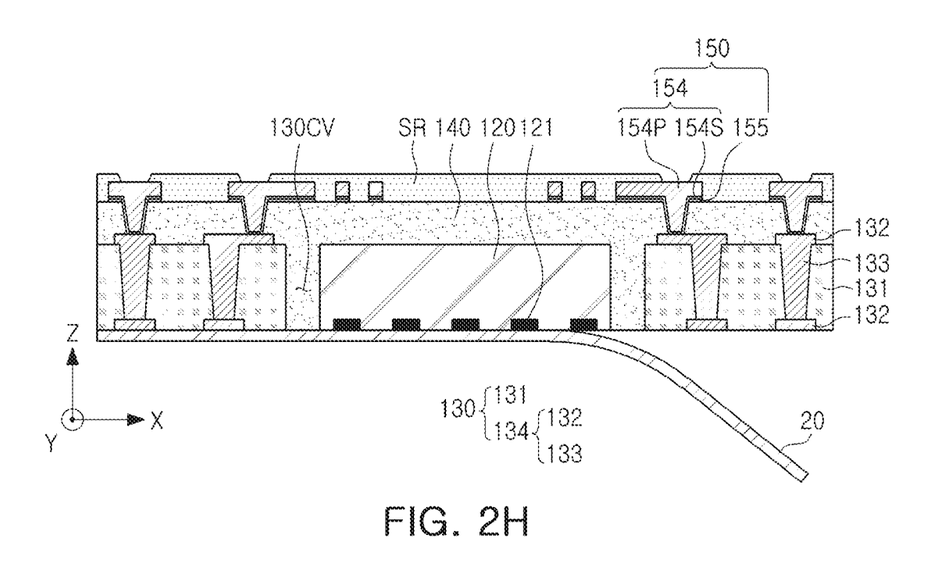

Referring to FIG. 2H, a solder resist layer SR covering the second redistribution conductor 154 may be formed on the encapsulant 140. The solder resist layer SR may be formed by coating and curing an insulating material on the encapsulant 140. An opening may be formed to partially expose the second redistribution conductor 154 by removing a portion of the solder resist layer SR. For example, when the solder resist layer SR includes the photo solder resist PSR, the opening may be formed by an exposure process and a developing process. Thereafter, the tape 20 may be removed to form a first redistribution structure for redistribution of the connection pad 121 of the semiconductor chip 120 and the connection conductor 134.

Figure 2I:
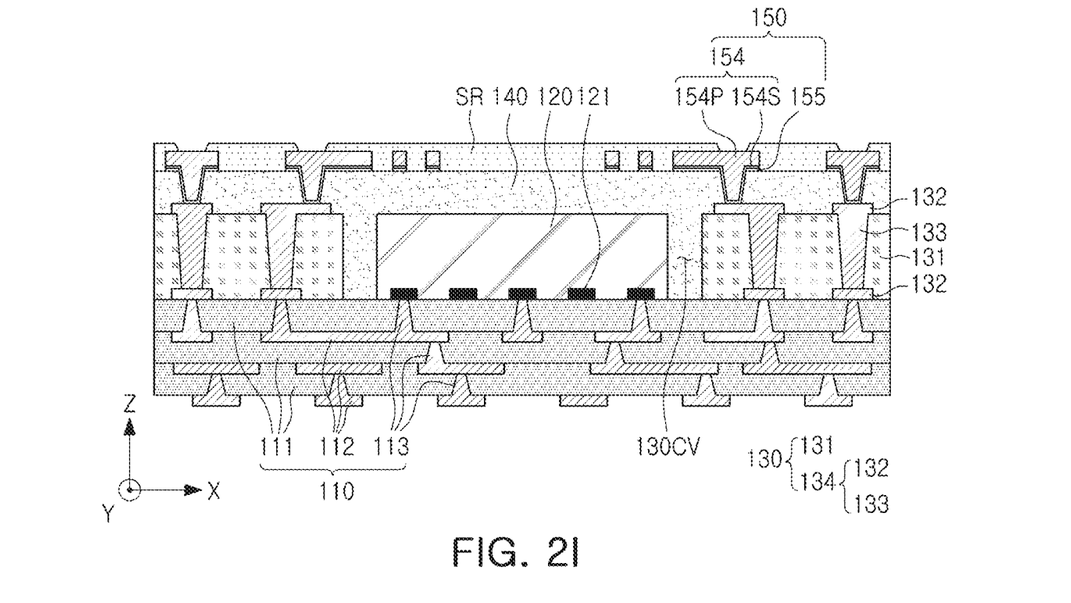

Referring to FIG. 2I, a first redistribution structure 110 including an insulating layer 111, a first redistribution layer 112, and a first redistribution via 113 may be formed below the semiconductor chip 120 and the connection conductor 134. The insulating layer 111 may be formed by coating and curing a photosensitive resin (e.g., PID). Next, an exposure process and a development process using a photomask may be performed to form via holes penetrating through the insulating layer 111. Next, the first redistribution via 113 and the first redistribution layer 112 may be formed using a plating process (e.g., an electroplating process). The first redistribution structure 110 including the plurality of insulating layers 111, the plurality of first redistribution vias 113, and the plurality of first redistribution layers 112 may be formed by repeating the above process.

Figure 3:
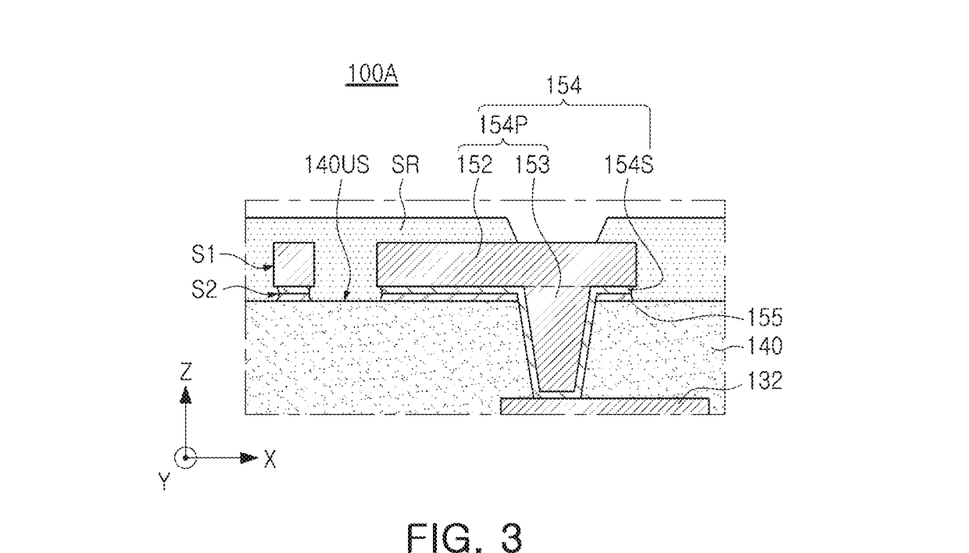
FIGS. 3, 4 and 5 are respective cross-sectional illustrating semiconductor packages 100A, 100B and 100C according to embodiments of the inventive concept.

FIG. 3 is a cross-sectional view illustrating in part (compare FIG. 1B) a semiconductor package 100A according to example embodiments of the inventive concept.

Referring to FIG. 3, the semiconductor package 100A may be substantially similar to the semiconductor package 100 of FIG. 1, except that a side surfaces S2 of the barrier layer 155 and the seed layer 154S may have a step difference with respect to the a side surface 51 of the pattern portion 152.

Since the preliminary barrier layer 155' and the preliminary seed layer 154S' are etched by the etching process of FIG. 2G, the side surface S2 of the barrier layer 155 and the seed layer 154S may not be aligned with the side surface 51 of the pattern portion 152. For example, the barrier layer 155 and the seed layer 154S may be over-etched such that the side surface S2 of the barrier layer 155 and the seed layer 154S is positioned within the width of the pattern portion 152. Thus, according to certain embodiments of the inventive concept, since both the barrier layer 155 and the seed layer 154S having respective side surfaces recessed by the sputtering process, the fine-pitch pattern portion 152 or second redistribution conductor 154 may be successfully implemented, notwithstanding the resulting step difference.

Figure 4:
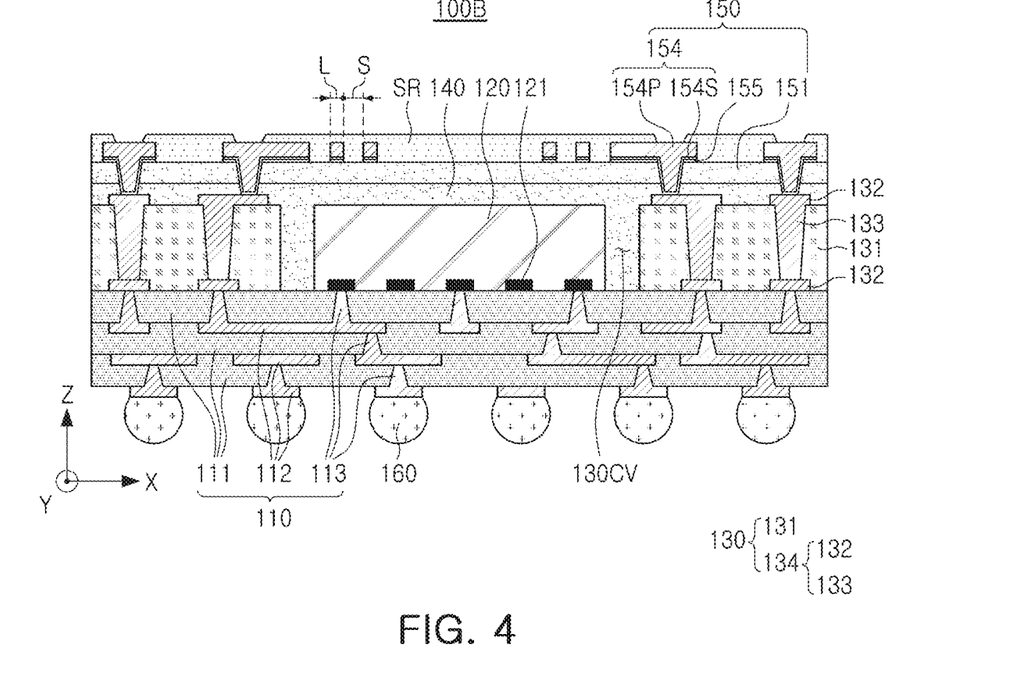

FIG. 4 is a cross-sectional view illustrating a semiconductor package 100B according to embodiments of the inventive concept.

Referring to FIG. 4, the semiconductor package 100B may further include an insulating layer 151 disposed between the encapsulant 140 and the barrier layer 155, but may otherwise be substantially similar to the semiconductor packages 100 and 100A of FIGS. 1 and 3, except that the second redistribution conductor 154 (or the via portion 153 of FIG. 1B) penetrates through a portion of each of the insulating layer 151 and the encapsulant 140 covering the upper surface of the connection conductor (e.g., 132). The insulating layer 151 may be formed by separately performing the transfer processes of the preliminary encapsulant 140' and the preliminary barrier layer 155' of FIG. 2B. For example, first, the encapsulant 140 is formed using the preliminary encapsulant 140', and the insulating layer 151 and the preliminary barrier layer 155' are simultaneously transferred onto the encapsulant 140 similarly to that illustrated in FIG. 2B, to form the insulating layer 151 between the encapsulant 140 and the barrier layer 155. The insulating layer 151 may be formed of a material similar to the encapsulant 140 (e.g., an insulating material such as ABF or an insulating resin such as an epoxy resin and an inorganic filler). The insulating layer 151 may improve adhesion between the encapsulant 140 and the barrier layer 155. In this case, the thickness of the encapsulant 140 and the insulating layer 151 may be adjusted in consideration of the overall thickness of the semiconductor package 100B. For example, the thickness of the semiconductor package 100 of FIG. 1 may be substantially the same as the thickness of the semiconductor package 100B of FIG. 4.

Figure 5:
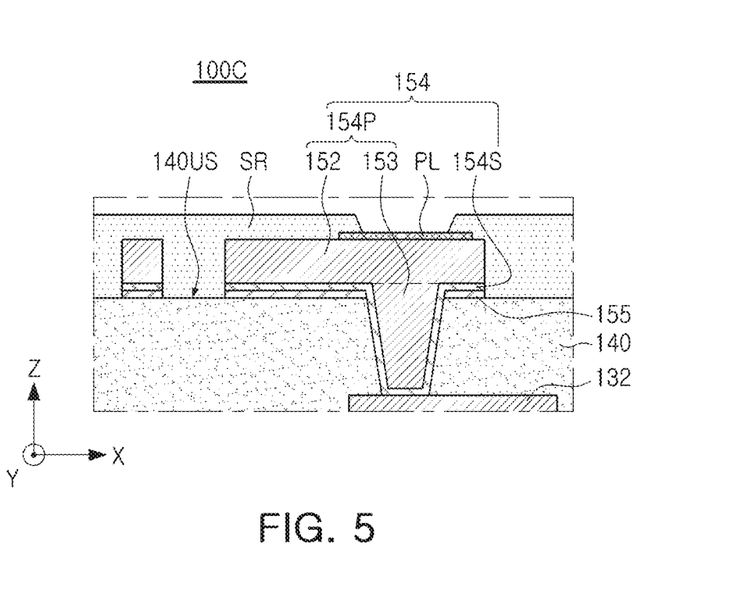

FIG. 5 is a cross-sectional view illustrating in part (compare FIG. 1B) a semiconductor package 100C according to embodiments of the inventive concept.

Referring to FIG. 5, the semiconductor package 100C be substantially similar to the semiconductor packages 100, 100A, and 100B of FIGS. 1, 3 and 4, except that it further includes a surface metal layer PL disposed on at least a portion of the second redistribution conductor 154 exposed through the opening of the solder resist layer SR. The solder resist layer SR may cover the second redistribution conductor 154, on the encapsulant 140, and may have an opening exposing a pad portion of the pattern portion 152. In this case, an oxide layer may be formed on the surface of the pattern portion 152 (or the second redistribution conductor 154) exposed through the opening. According to the present example embodiment, by disposing the surface metal layer PL resistant to oxidation on the pattern portion 152 exposed through the opening, connection reliability of the second redistribution conductor 154 may be secured. The surface metal layer PL may include a metal material having excellent corrosion resistance. Here, the surface metal layer PL may be a single-layer or multi-layer structure including at least one of, for example, Ni, Au, or alloys including same.

Figure 6A:
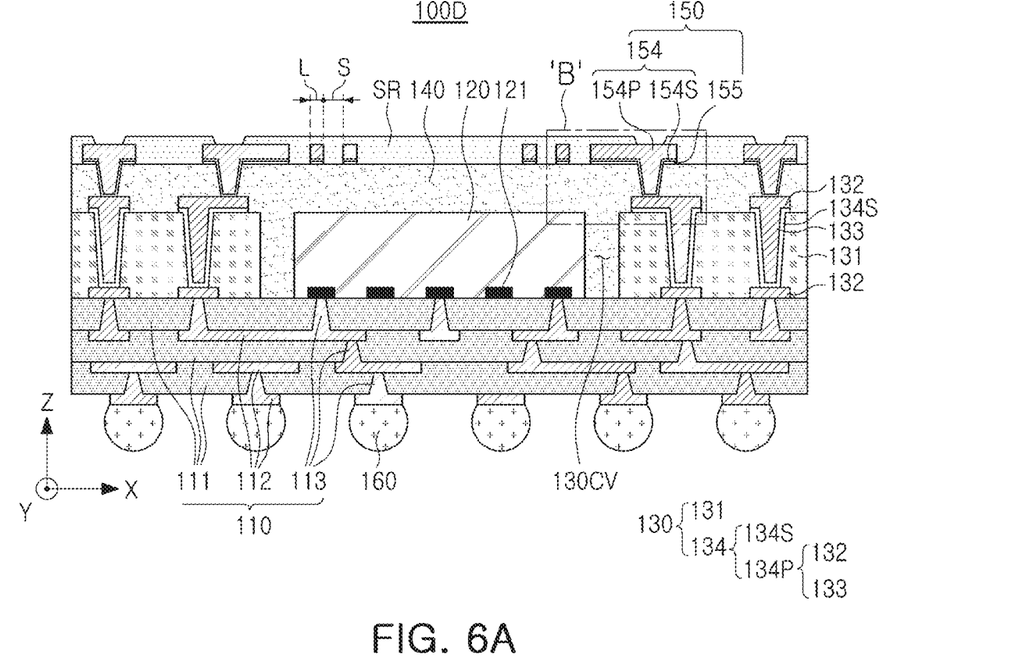
FIG. 6A is a cross-sectional view illustrating a semiconductor package 100D according to embodiments of the inventive concept.
Figure 6B:
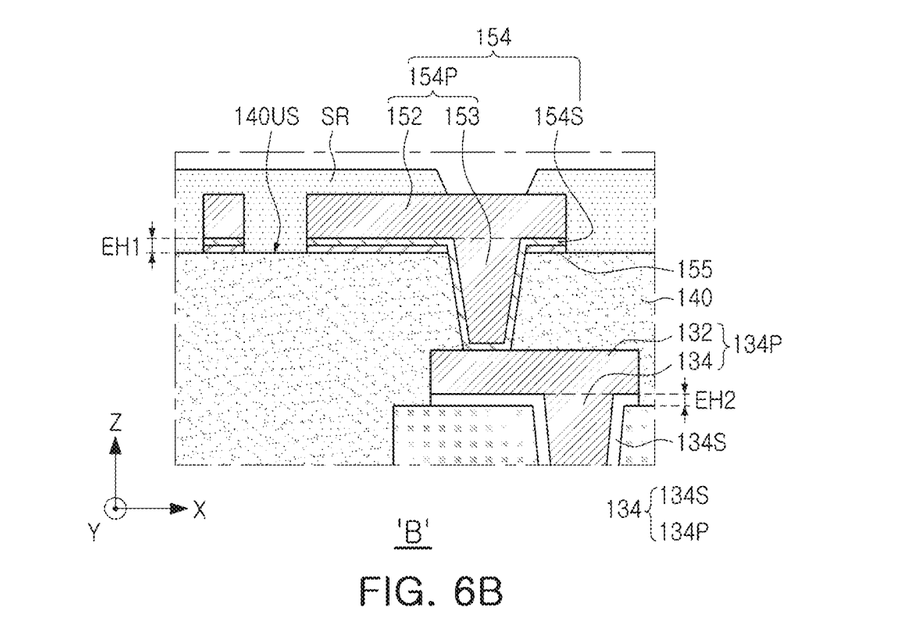
FIG. 6B is an enlarged view of region 'B' indicated in FIG. 6A.

FIG. 6A is a cross-sectional view illustrating a semiconductor package 100D according to embodiments of the inventive concept, and FIG. 6B is a partial enlarged view further illustrating region 'B' indicated in FIG. 6A.

Referring to FIGS. 6A and 6B, the semiconductor package 100D may include a connection conductor 134 including a first seed layer 134S and a first plating layer 134P on the first seed layer 134S, and a second redistribution conductor 154 a second seed layer 154S and a second plating layer 154P on the second seed layer 154S. According to certain embodiments, by introducing the barrier layer 155, since the second redistribution conductor 154 having a fine pitch is implemented, the second redistribution conductor 154 may have a relatively fine pitch compared to the connection conductor 134. Accordingly, a thickness EH1 of the barrier layer 155 and the second seed layer 154S disposed below the second plating layer 154P may be less than a thickness EH2 of the first seed layer 134S disposed below the first plating layer 134P. For example, the thickness EH1 of the second seed layer 154S and the barrier layer 155 may be about 1 µm or less (e.g., may range from about 1 µm to about 0.001 µm, about 0.8 µm to about 0.001 µm, about 0.6 µm to about 0.001 µm, or the like).

Figure 7:
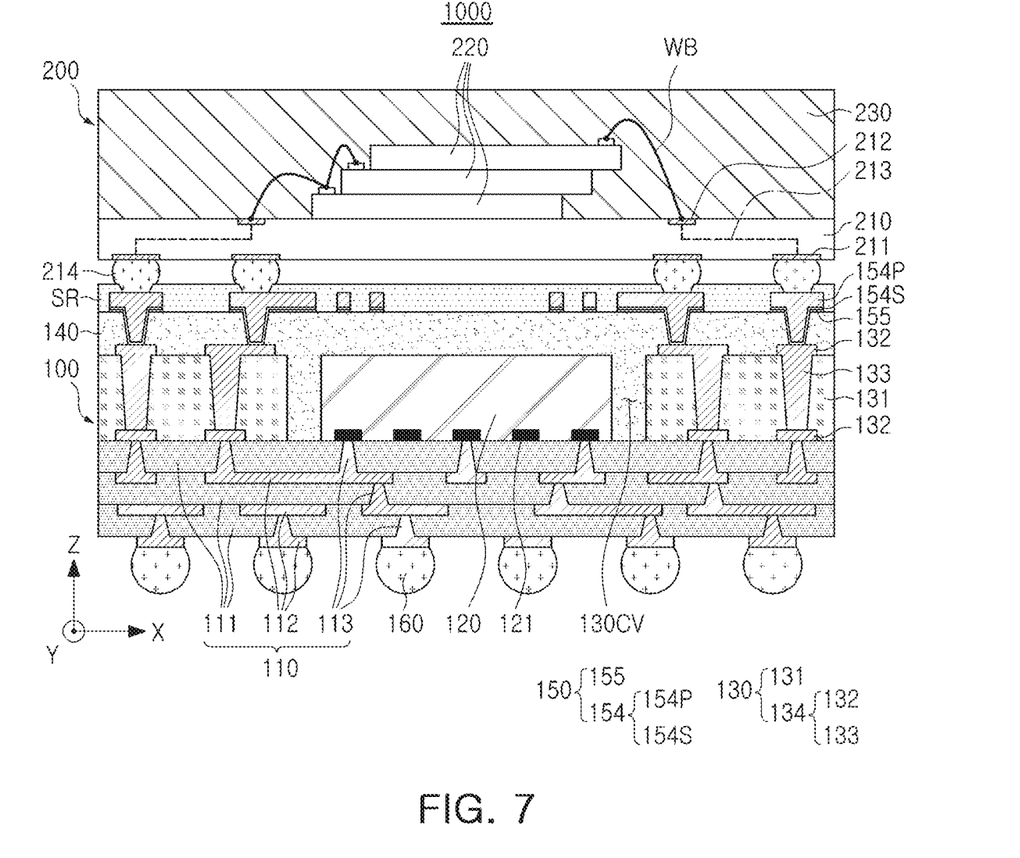
FIG. 7 is a cross-sectional view illustrating a semiconductor package 1000 according to embodiments of the inventive concept.

FIG. 7 is a cross-sectional view illustrating a semiconductor package 1000 according to embodiments of the inventive concept.

Referring to FIG. 7, the semiconductor package 1000 may have a package-on-package structure including a first package 100 and a second package 200. The first package 100 may be substantially similar to the semiconductor packages 100, 100A, 100B, 100C, and 100D described above.

The second package 200 may include a redistribution substrate 210, a second semiconductor chip 220, and a second encapsulant 230. The second redistribution substrate 210 may include a lower pad 211 and an upper pad 212 electrically connected to an external source, on the lower surface and the upper surface thereof, respectively. Also, the second redistribution substrate 210 may include a redistribution circuit 213 connected to the lower pad 211 and the upper pad 212 therein.

The second semiconductor chip 220 may be mounted on the second redistribution substrate 210 using wire bonding technique and/or a flip-chip bonding technique. For example, the second semiconductor chips 220 may be vertically stacked on the redistribution substrate 210 and electrically connected to the upper pad 212 of the redistribution substrate 210 by a bonding wire WB. In an example, the second semiconductor chip 220 may include a memory chip, and the first semiconductor chip 120 may include an AP chip.

The second encapsulant 230 may include the same or similar material to the encapsulant 140 of the first package 100. The second package 200 may be physically and electrically connected to the first package 100 by metal bumps 214. The metal bump 214 may be electrically connected to the redistribution circuit 213 inside of the redistribution substrate 210 through the lower pad 211 on the lower surface of the redistribution substrate 210. The metal bump 214 may be formed of a low-melting-point metal, such as for example, Sn or a Sn alloy.

As set forth above in relation to certain illustrated embodiments, a semiconductor package consistent with the inventive concept may include a backside redistribution structure having a fine pitch that is structurally and/or functionally improved by the introduction of a barrier layer below a seed layer of a backside redistribution conductor.

While example embodiments have been illustrated and described above, it will be apparent to those skilled in the art that modifications and variations could be made without departing from the scope of the inventive concept as defined by the appended claims.

What is claimed is:

1. A semiconductor package, comprising:
    a first redistribution structure including first redistribution conductors;
    a semiconductor chip on the first redistribution structure and including connection pads electrically connecting the first redistribution conductors;
    a connection conductor on the first redistribution structure, laterally spaced apart from the semiconductor chip, and electrically connected to the first redistribution conductors;
    an encapsulant on the first redistribution structure and sealing the semiconductor chip and at least a portion of the connection conductor;
    a barrier layer extending along an upper surface of the encapsulant; and
    a second redistribution conductor on the barrier layer and penetrating the barrier layer to contact the connection conductor.

2. The semiconductor package of claim 1, wherein the encapsulant covers an upper surface of the semiconductor chip and at least a portion of an upper surface of the connection conductor, and
    the second redistribution conductor penetrates through the barrier layer and the encapsulant.

3. The semiconductor package of claim 1, wherein the barrier layer includes nickel, and the second redistribution conductor includes copper.

4. The semiconductor package of claim 1, wherein the encapsulant includes an insulating material including an inorganic filler.

5. The semiconductor package of claim 1, wherein the barrier layer is not in contact with the connection conductor.

6. The semiconductor package of claim 1, further comprising:
    a solder resist layer on the encapsulant, covering the second redistribution conductor and including an opening exposing at least a portion of the second redistribution conductor.

7. The semiconductor package of claim 6, further comprising:
    a surface metal layer on the at least a portion of the second redistribution conductor exposed through the opening.

8. The semiconductor package of claim 7, wherein the surface metal layer includes nickel.

9. A semiconductor package comprising:
a first redistribution structure including first redistribution conductors;
a semiconductor chip on the first redistribution structure and including connection pads electrically connecting the first redistribution conductors;
a connection conductor on the first redistribution structure, laterally spaced apart from the semiconductor chip, and electrically connecting the first redistribution conductors;
an encapsulant on the first redistribution structure and sealing the semiconductor chip and at least a portion of the connection conductor;
a barrier layer on the encapsulant; and
a second redistribution conductor electrically connected to the first redistribution conductor through the connection conductor and including a pattern portion on the barrier layer, and a via portion penetrating through the barrier layer and extending from the pattern portion towards the connection conductor.

10. The semiconductor package of claim 9, wherein the second redistribution conductor includes a seed layer and a plating layer on the seed layer,
the plating layer includes the pattern portion and the via portion, and
the seed layer extends along a lower surface of the pattern portion and a side surface and a lower surface of the via portion.

11. The semiconductor package of claim 10, wherein the seed layer is separated from an upper surface of the encapsulant by the barrier layer.

12. The semiconductor package of claim 10, wherein the via portion is disposed in a through-hole penetrating the barrier layer and a portion of the encapsulant to expose at least a portion of the connection conductor, and
the seed layer directly contacts the encapsulant in the through-hole.

13. The semiconductor package of claim 10, wherein each of the seed layer and the plating layer includes copper, and the barrier layer includes nickel.

14. The semiconductor package of claim 10, wherein a thickness of the seed layer is about 1 μm or less.

15. The semiconductor package of claim 9, wherein the barrier layer has a thickness of about 1 μm or less.

16. The semiconductor package of claim 9, wherein a side surface of the barrier layer has a step difference with respect to a side surface of the pattern portion.

17. The semiconductor package of claim 9, further comprising:
an insulating layer between the encapsulant and the barrier layer, wherein the via portion penetrates the insulating layer and a portion of the encapsulant covering an upper surface of the connection conductor.

18. A semiconductor package comprising:
a first redistribution structure including first redistribution conductors;
a semiconductor chip on the first redistribution structure and including connection pads electrically connected to the first redistribution conductors;
a connection conductor on the first redistribution structure, laterally spaced apart from the semiconductor chip, and including a first seed layer and a first plating layer on the first seed layer;
an encapsulant sealing the semiconductor chip and at least a portion of the connection conductor;
a barrier layer extending along an upper surface of the encapsulant; and
a second redistribution conductor on the barrier layer, penetrating through the barrier layer to contact the connection conductor, and including a second seed layer and a second plating layer on the second seed layer.

19. The semiconductor package of claim 18, wherein the second seed layer has a thickness less than a thickness of the first seed layer.

20. The semiconductor package of claim 18, wherein a combination of the barrier layer and the second seed layer has a thickness of about 0.6 μm or less.

* * * * *